(12) United States Patent
van Schaik et al.

(10) Patent No.: US 6,583,858 B2
(45) Date of Patent: Jun. 24, 2003

(54) SUBSTRATE HOLDER FOR LITHOGRAPHIC APPARATUS

(75) Inventors: Frank van Schaik, Veldhoven (NL); Gerardus J. J. Keijsers, Venlo (NL)

(73) Assignee: ASML Netherlands B.V., Veldhoven (NL)

( * ) Notice: Subject to any disclaimer, the term of this patent is extended or adjusted under 35 U.S.C. 154(b) by 20 days.

(21) Appl. No.: 09/805,179

(22) Filed: Mar. 14, 2001

(65) Prior Publication Data

US 2001/0022652 A1 Sep. 20, 2001

(30) Foreign Application Priority Data

Mar. 16, 2000 (EP) .............................................. 00302161

(51) Int. Cl.[7] .......................... G03B 27/58; G03B 27/60
(52) U.S. Cl. .............................. 355/72; 355/73; 355/74
(58) Field of Search ............................... 355/72, 73, 74

(56) References Cited

U.S. PATENT DOCUMENTS

| | | | | |
|---|---|---|---|---|
| 5,191,218 A | * | 3/1993 | Mori et al. ............ | 250/453.11 |
| 5,563,683 A | * | 10/1996 | Kamiya ..................... | 355/53 |
| 5,703,493 A | * | 12/1997 | Weeks et al. .............. | 324/755 |
| 5,822,172 A | * | 10/1998 | White ....................... | 279/128 |
| 5,825,463 A | * | 10/1998 | Hara et al. ................. | 355/72 |
| 5,923,408 A | * | 7/1999 | Takabayashi ............... | 269/21 |
| 5,966,203 A | * | 10/1999 | Bowen ........................ | 355/73 |
| 6,032,997 A | * | 3/2000 | Elliott et al. ................ | 269/21 |
| 6,137,562 A | * | 10/2000 | Masuyuki et al. ........... | 355/53 |
| 6,184,972 B1 | * | 2/2001 | Mizutani et al. ............. | 269/21 |

* cited by examiner

*Primary Examiner*—Rodney Fuller
(74) *Attorney, Agent, or Firm*—Pillsbury Winthrop LLP

(57) ABSTRACT

An intermediate substrate holder for use in a lithographic projection apparatus, which holder can itself be held by a standard substrate holder in the lithographic projection apparatus and in turn can hold a non-standard substrate. The intermediate substrate holder includes at least one of a vacuum holder and a mechanical clamp. The vacuum holder includes a vacuum space on which the non-standard substrate is placed; a barrier around the edge of the vacuum space that closes off the vacuum space and that makes a sealing contact with the non-standard substrate; and a vacuum generator. The mechanical clamp may include two or more stationary positioning pins opposed by a slidable mechanism which is provided with at least one sliding positioning pin mounted thereon and which is biased to move the sliding positioning pin towards the stationary pins.

14 Claims, 7 Drawing Sheets

SUBSTRATE HOLDER FOR LITHOGRAPHIC APPARATUS

BACKGROUND OF THE INVENTION

1. Field of the Invention

The present invention relates to substrate holders, especially those for holding thin, substantially planar substrates. More particularly, the invention relates to such substrate holders as used in lithographic projection apparatus comprising:

- a radiation system for supplying a projection beam of radiation;
- a support structure for supporting patterning means, the patterning means serving to pattern the projection beam according to a desired pattern;
- a substrate table provided with first holding means for holding a substrate of a first type; and
- a projection system for projecting the patterned beam onto a target portion of the substrate.

2. Description of the Related Art

The term "patterning means" or "mask" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning means include:

- A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensured that the mask can be held at a desired position in the incoming radiation beam, and that it can be moved relative to the beam if so desired.
- A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from United States Patents U.S. Pat. Nos. 5,296,891 and 5,523,193, which are incorporated herein by reference. In the case of a programmable mirror array, the said support structure may be embodied as a frame or table, for example, which may be fixed or movable as required.
- A programmable LCD array. An example of such a construction is given in United States Patent U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning means as hereabove set forth.

Lithographic projection apparatus can be used, for example, in the manufacture of integrated circuits (ICs). In such a case, the patterning means may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

In a lithographic apparatus, the substrate table is generally designed to hold substrates that have standard sizes and shapes. Typically, the smallest substrate that can be held is a circular substrate with a diameter of 75 mm (3"). Substrate tables are generally designed so as to have holding means tailored to standard substrates; it is vital that the holding means be capable of holding the substrate immobile, and designing such means for a standard size/type of substrate allows the design to be optimized. Various other types of substrate supporting tables—such as found in auxiliary apparatus, substrate handling components, substrate transport devices, etc.—are also generally designed to handle substrates of a standard size and shape.

However, there are occasions when it may be desirable to process a substrate that is either not of a standard size or not of a standard shape. For example, conventionally used SiC substrates generally have a diameter of 50 mm (2"), which is too small for most conventional substrate holding means. Also, substrates may have different shapes than the standard. Most substrates are fully round, or may have a limited flat portion (hereafter referred to as a "flat") along part of their circumference; however square or rectangular substrates of various sizes may also be desirable (e.g. when dealing with ceramic substrates for magnetic head production). Moreover, it may be desirable to process irregular shapes, each of which may be unique (e.g. as a result of breakage of a larger substrate into irregular pieces). These shapes and sizes are relatively uncommon, and it is rarely economical to design and build a substrate table and handling components specifically tailored to such non-standard substrates.

SUMMARY OF THE INVENTION

An object of the present invention is to provide means by which non-standard substrates (substrates of a "second type") can be used in a lithographic projection apparatus having a substrate table designed to hold a particular size and shape of substrate (substrates of a "first type").

According to the present invention, there is provided a lithographic projection apparatus as specified in the opening paragraph, characterized by an intermediate substrate holder which can be held by the first holding means and is provided with second holding means for holding a substrate of a second type.

According to a further aspect of the invention, there is provided an intermediate substrate holder for holding a substrate (of a second type), said holder comprising:

a substantially planar body having a first major surface;

a matrix of protrusions extending from said first major surface, for supporting the substrate;

barrier means provided on said first major surface for defining a vacuum space between that surface and a substrate resting against the said protrusions;

means for exposing the vacuum space to a vacuum.

The present invention is advantageous because an intermediate substrate holder—which can be held on the first holding means on a substrate table in the standard manner, and which itself can hold a (non-standard) substrate of the second type upon its own (second) holding means—provides a means whereby such a (non-standard) substrate of the second type can be processed by the (standard) holding means of the first type on a conventional substrate table, without requiring substantial modification to the substrate table or the holding means thereupon. Ideally, the intermediate substrate holder, with the non-standard substrate attached, would be such that it could also be handled by other substrate handling apparatus, without such handling apparatus requiring modification. Thus, although extra software may be required to control the apparatus, the hardware of the apparatus would not require modification.

A particular advantage of this invention is that it allows the processing of broken substrates to be completed. Breakage is an unfortunate problem that can occur during the processing of substrates. Substrates typically contain many devices that are being simultaneously manufactured. If the substrate is broken, it is likely that some of the devices that are being manufactured on the substrate (i.e. those not on the fracture lines) will be undamaged. It is therefore desirable to be able to continue the processing of these undamaged devices, in view of the cost that has already been incurred in the manufacturing process up to that stage. Obviously, these pieces of substrate will no longer be of a standard shape or size, and designing a substrate holder for each one would not be sensible.

According to a further aspect of the invention, there is provided a method of manufacturing a device comprising the steps of:

(a) providing a substrate that is at least partially covered by a layer of radiation-sensitive material;

(b) holding the substrate on a substrate table having first holding means for holding a substrate of a first type;

(c) providing a projection beam of radiation using a radiation system;

(d) using patterning means to endow the projection beam with a pattern in its cross-section;

(e) projecting the patterned beam of radiation onto a target portion of the layer of radiation-sensitive material, characterized in that steps (a) and (b) comprise the steps of:

providing a substrate of a second type, having a layer of radiation-sensitive material, to an intermediate substrate holder that is capable of holding the substrate of the second type and can itself be held by the first holding means on the substrate table; and providing the intermediate substrate holder, with the substrate of the second type held thereon, to said substrate table.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultraviolet radiation, e.g. having a wavelength in the range 5–20 nm), as well as particle beams, such as ion beams or electron beams.

BRIEF DESCRIPTION OF THE DRAWINGS

The present invention will be described below with reference to exemplary embodiments and the accompanying schematic drawings, in which.

In the drawings, like reference numerals indicate like parts.

DETAILED DESCRIPTION OF THE INVENTION

Figure 1:
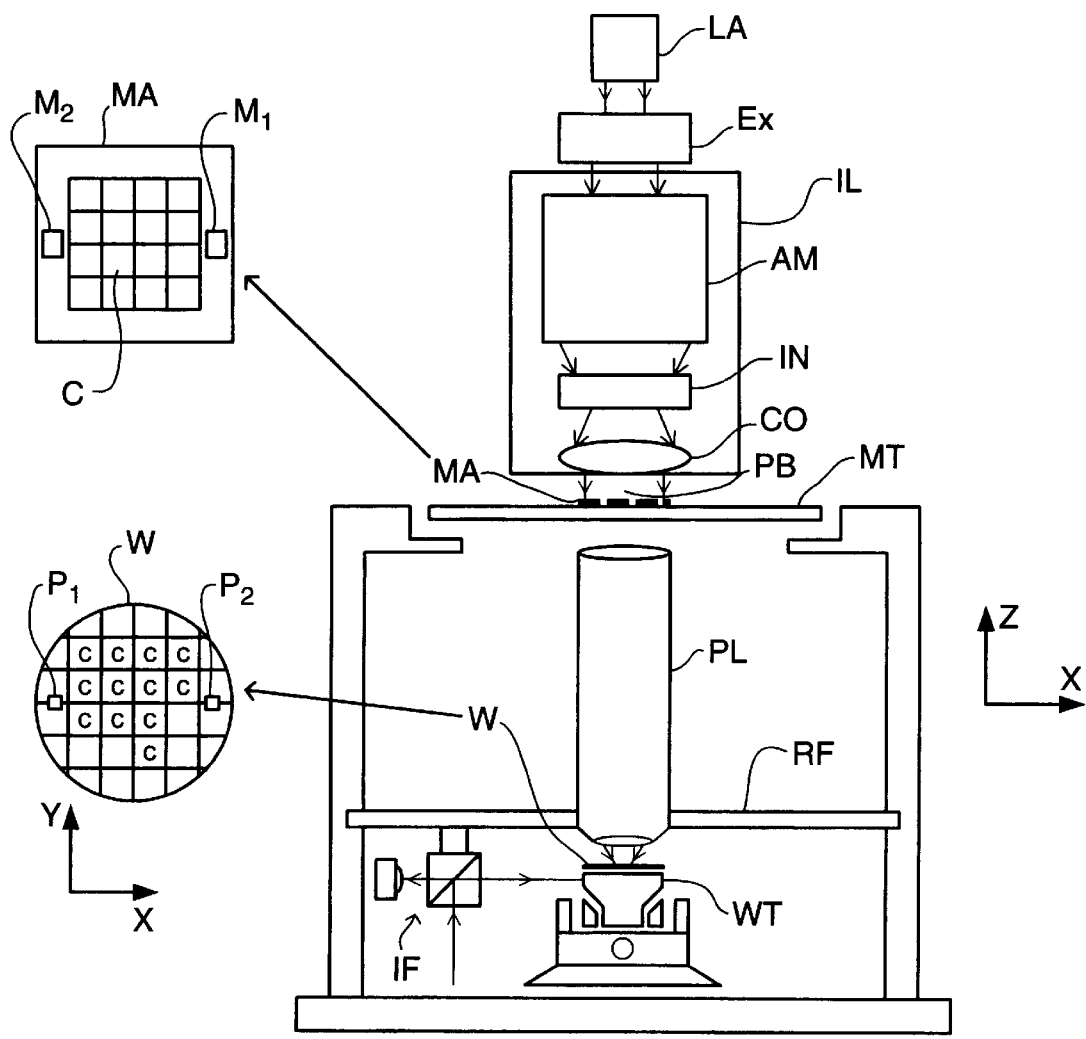
FIG. 1 depicts a lithographic projection apparatus suitable for use with the invention.

FIG. 1 schematically depicts a lithographic projection apparatus according to a particular embodiment of the invention. The apparatus comprises:

- a radiation system Ex, IL, for supplying a projection beam PB of radiation (e.g. UV, EUV or charged-particle radiation). In this particular case, the radiation system also comprises a radiation source LA;
- a mask table MT provided with a mask holder for holding a mask MA (e.g. a reticle), and connected to mask positioning means for accurately positioning the mask with respect to item PL;
- a substrate table WT provided with first holding means for holding a substrate W (e.g. a resist-coated silicon wafer) of a first type, and connected to substrate positioning means for accurately positioning the substrate with respect to item PL;
- a projection system ("lens") PL (e.g. a refractive, reflective or catadioptric lens system, or a collection of electric and/or magnetic field deflectors) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type (with a reflective mask). Alternatively, the apparatus may employ another kind of patterning means, such as a programmable mirror array of a type as referred to above.

The source LA (e.g. a lamp, laser, plasma discharge source or electron or ion gun) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) or other parameters of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the substrate positioning means (and interferometric measuring means IF), the substrate table WT can be moved accurately, e.g. so as to position different target portions C in the path of the beam PB. Similarly, the mask positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
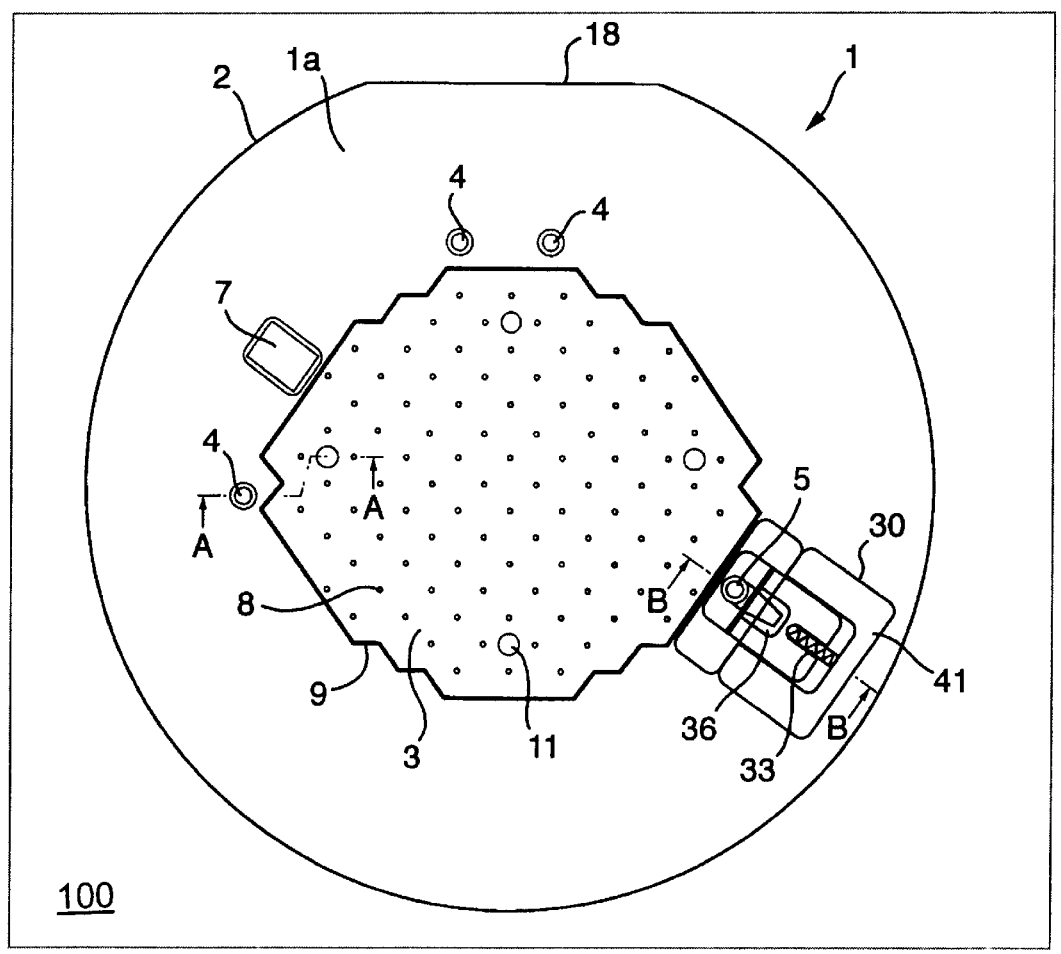
FIG. 2 is a plan view of an intermediate substrate holder according to a first embodiment of the invention.

FIG. 2 shows a plan view of an example of an intermediate substrate holder 1 that can be used in conjunction with the first holding means (100) provided on the substrate table WT referred to above. The intermediate substrate holder is the same size and shape as that of a (standard) substrate W of a first type for which the lithographic projection apparatus is designed; specifically, it is thin and substantially planar, with a perimeter 2 which is either fully round or is provided with a flat 18 (as in the example shown in FIG. 2).

The lower surface (second major surface) of the intermediate substrate holder 1 is substantially flat. The upper surface (first major surface) 1a is comprised of a central area 3—on which a (non-standard) substrate 10 of a second type (not shown in FIG. 2) can be placed for processing—and positioning pins 4, 5 for fastening the non-standard substrate 10 to the intermediate holder during non-position-critical processes (e.g. transferring operations). The intermediate substrate holder is also provided with a recess 7 which facilitates the placing, e.g. with tweezers, of a non-standard substrate 10 onto the intermediate substrate holder 1.

The intermediate substrate holder should be very thin, e.g. approximately 2 mm, to enable the combination of the intermediate substrate holder and the non-standard substrate 10 to be passed through wafer handling apparatus and to fit under the projection system. The intermediate substrate holder should also generally be made to very tight tolerances, and is therefore preferably made from a vitreous material. A typical choice would be Zerodur™, inter alia because of its very low thermal expansion coefficient.

The central area 3 on the upper surface of the intermediate substrate holder 1 is used for supporting the non-standard substrate 10 and fixedly holding it during alignment and exposure (for example), when the position of the substrate is critical. It is comprised of a matrix pattern of protrusions 8, a barrier 9, and through-holes 11. The protrusions 8 are commonly embodied as burls or pimples.

The protrusions 8 are accurately machined on the upper surface 1a of the intermediate substrate holder 1 and support the non-standard substrate 10 when it is placed on the intermediate substrate holder. The through-holes 11 are interspersed amongst the protrusions 8 and pass completely through the intermediate substrate holder, such that when the underside of the intermediate substrate holder 1 is exposed to a vacuum, the space around the protrusions 8 (the vacuum space) is also exposed to the vacuum. The barrier 9 (also referred to as a "vacuum wall") is arranged around the protrusions 8 on the upper surface of the intermediate substrate holder, and serves to delineate (bound) the said vacuum space. Thus, when the space around the protrusions 8 is exposed to a vacuum, the non-standard substrate 10 is held fixedly to the intermediate substrate holder 1. By "vacuum" is meant a relatively low pressure, sufficient to fix the substrate to the holder without requiring an absolute vacuum.

A similar arrangement (i.e. a matrix arrangement of protrusions embraced by a vacuum wall) is used to hold (standard) substrates W of the first type to the first holding means 100. Thus, when the intermediate substrate holder 1—which is tailored to be held by the first holding means 100 in the same way as a standard substrate W—is attached to the first holding means 100, it is held by a vacuum that acts on the lower side of the intermediate substrate holder 1. Therefore, the through-holes 11 of the intermediate substrate holder 1 will be exposed to the vacuum that holds the intermediate substrate holder 1 to the first holding means 100, and the same vacuum will hold the non-standard substrate 10 to the intermediate substrate holder 1; this thus occurs without any modification of the first holding means 100. A sectional view of part of the intermediate substrate holder 1, including two protrusions 8, the barrier 9 and a vacuum through-hole 11, is shown in FIG. 3.

Figure 3:
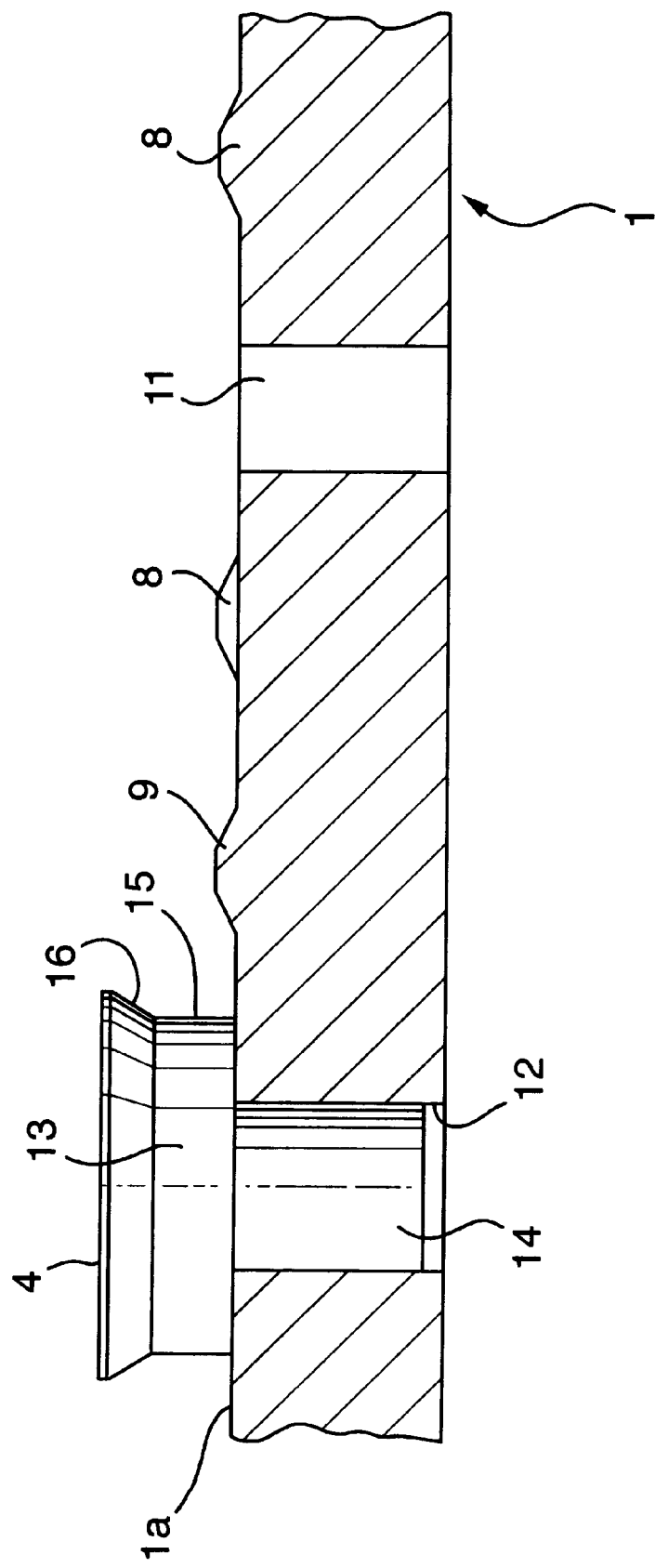
FIG. 3 is the sectional view of the intermediate substrate holder marked AA on FIG. 2.

FIG. 3 also shows a sectional view of one of the positioning pins 4. The positioning pin 4 is comprised of a shaft 14, which is located in a hole 12 in the intermediate substrate holder 1, and a head 13, which has a cross section greater than that of both hole 12 and shaft 14, and is located on the upper surface 1a of the intermediate substrate holder 1. The side 15 of the head 13 is substantially vertical, and has lip 16, at the top, which engages with the edge of the non-standard substrate 10. The shaft 14 of the positioning pin 4 is secured in the hole 12 by means of, for example, a glue.

The positioning pins 4, 5 are arranged around the central area 3 on the upper surface 1a of the intermediate substrate holder 1, outside of the area defined by the barrier 9. The non-standard substrate 10 can be attached to the intermediate substrate holder 1 by means of the positioning pins, as well as by application of a vacuum. In the embodiment shown in FIG. 2, there are three stationary positioning pins 4, arranged around one side of the central area 3, and a fourth positioning pin 5, mounted on a slidable clamping mechanism 30 (shown in FIGS. 1 and 4), on the opposite side of the central area 3. When the slidable clamping mechanism 30 is in a clamping position, the non-standard substrate 10 is held between the stationary positioning pins 4, mounted directly on the intermediate substrate holder 1, and the slidable pin 5, mounted on the slidable clamping mechanism 30. The lip 16 on the stationary positioning pins 4, and a corresponding lip 56 on the slidable pin 5, hold the non-standard substrate 10 down onto the protrusions 8 of the intermediate substrate holder 1.

These mechanical means of holding the non-standard substrate 10 to the intermediate substrate holder 1 are necessary for the operations that take place when there is no vacuum to hold the non-standard substrate 10 to the intermediate substrate holder 1, such as transport operations. This allows the non-standard substrate to be put through processing steps without the equipment requiring modification.

Physical restraint of the non-standard substrate 10 by pins 4, 5 leads to the potential problem of wear, and more particularly to problems of contamination of the substrate by wear particles. For this reason, the pins 4, 5 are preferably made from a ceramic material with very high wear resistance, such as Aluminum Oxide. They are also preferably replaceable.

Figure 4:
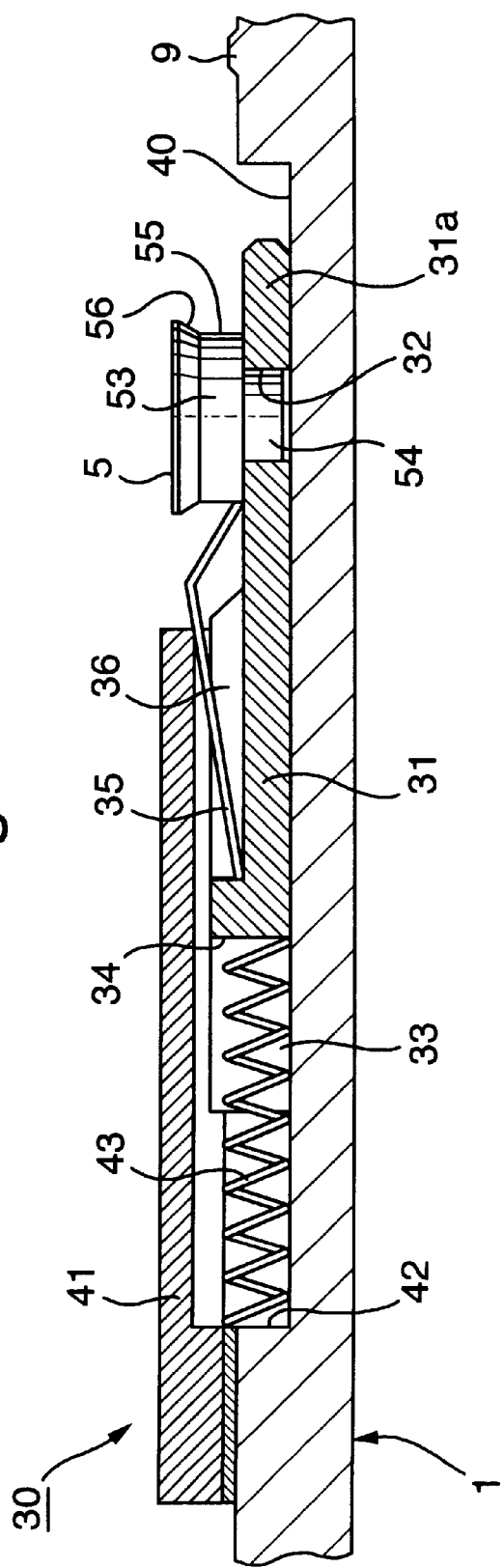
FIG. 4 is the sectional view of the intermediate substrate holder marked BB on FIG. 2.

A sectional view of the slidable clamping mechanism 30 is shown in FIG. 4. The slidable clamping mechanism 30 is located on the upper surface 1a of the intermediate substrate holder 1 outside the area defined by the barrier 9, with the slidable positioning pin 5, which is mounted upon it, reciprocally slidable in a substantially radial direction. The slidable clamping mechanism 30 is comprised of a recess 40, which is machined in the intermediate substrate holder 1, and a slider 31 that fits in the recess 40. The slider 31 can slide in the recess 40 between two positions: an open position (to the left as shown in FIG. 4), in which position the non-standard substrate 10 may be placed on or removed from the intermediate substrate holder 1, and a clamping position (to the right as shown in FIG. 4), in which the non-standard substrate 10 will be held on the intermediate substrate holder 1 between the positioning pins 4, 5. The slider 31 is biased by spring 43 to the clamping position. Spring 43 acts between the end face 34 of a slot 33 in the slider 31 and the end face 42 of the recess 40 in the intermediate substrate holder 1. The slider may also be provided with a catching means or detent (not shown) such that, when it is in the fully open position, it will remain in that position until pushed at least partway towards the clamping position.

The recess 40 has a lid 41 that covers it for the majority of its length. The slider 31 is held down in the bottom of the recess 40 by a leaf spring 35 that acts against the underside of the lid 41. The leaf spring 35 is located in a second channel 36 in the slider.

The slider 31 is fitted with a positioning pin 5 (the slidable positioning pin) which is similar to the positioning pins 4 that are fitted directly onto the intermediate substrate holder 1 (the stationary positioning pins). As in the case of the stationary positioning pins, slidable positioning pin 5 has a shaft 54 that is located in a through-hole 32 in the slider and a head 53 that has a larger cross section than the shaft 54 or through-hole 32, and is located on the upper surface 31a of the slider 31. Also, as in the stationary positioning pins 4, the slidable positioning pin 5 has a substantially vertical side 55 and a lip 56 for holding the non-standard substrate 10 in place, and the shaft 54 is secured in the through-hole 32 by means of, for example, a glue.

The recess lid 41 and the slider 31 are both subject to the same material requirements as the main body of the intermediate substrate holder 1, and should preferably be made of the same material, e.g. a vitreous material such as Zerodur™.

As stated above, it is a requirement that the present invention be able to hold substrates that are non-standard because of size or shape, including pieces of substrate that have broken off standard substrates. FIGS. 5 to 8 show schematically how the present invention can be used to hold different non-standard substrates.

Figure 5:
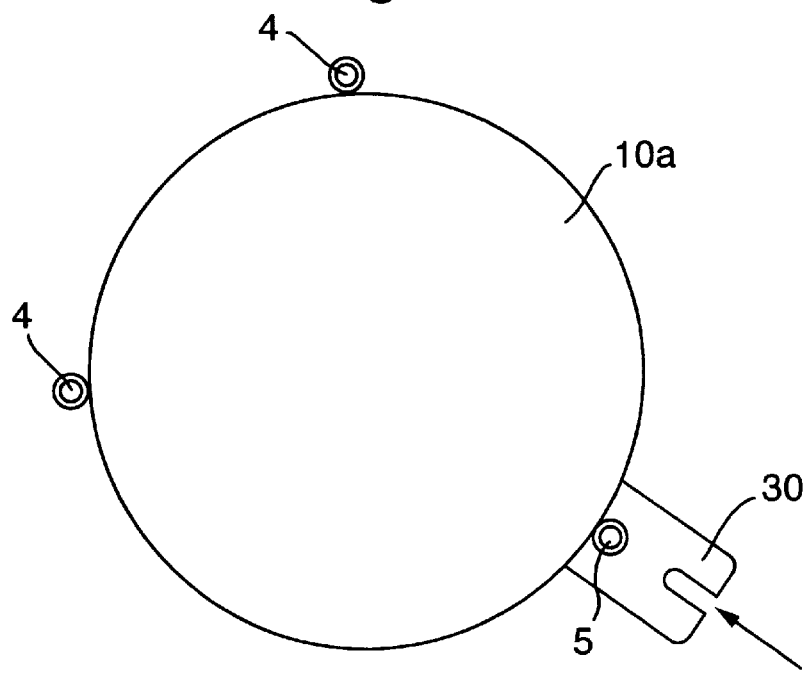
FIG. 5 is a schematic plan view of the intermediate substrate holder of a second embodiment of the invention, showing the pin layout required to hold a smaller-than-standard substrate that is fully round.

FIG. 5 shows one embodiment of the intermediate substrate holder 1 of the present invention with a fully round substrate 10a that is smaller than standard. In this case, the substrate can be held stable by three pins, two of which are the stationary pins 4, mounted directly onto the upper surface of the intermediate substrate holder, and the other of which is mounted on the slidable clamping means 30.

Figure 6:
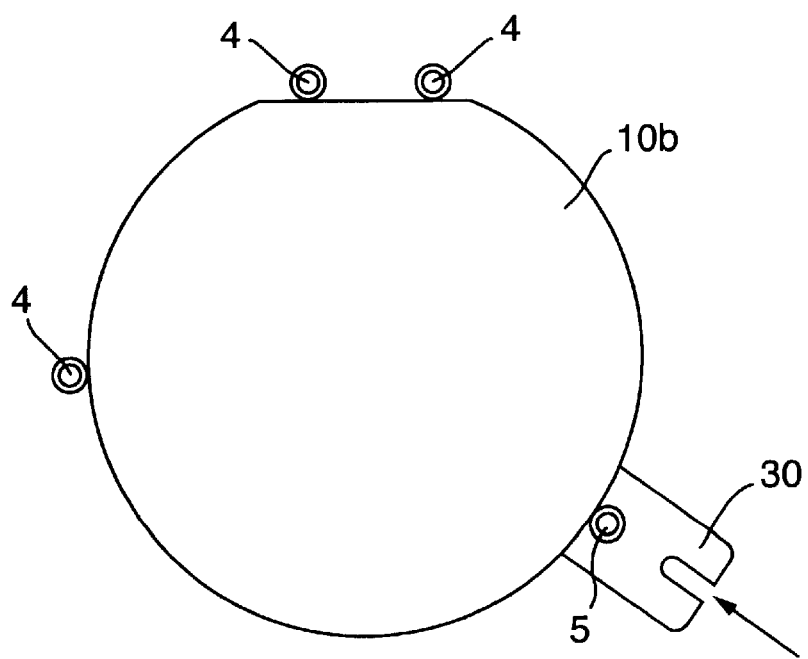
FIG. 6 is a schematic plan view of the intermediate substrate holder of the second embodiment of the invention, showing the pin layout required to hold a smaller-than-standard substrate with a flat.

FIG. 6 shows the intermediate substrate holder 1 of the present invention with a substrate 10b that is smaller than standard and has a flat. In this case, three stationary positioning means are required, two of which engage the flat in order to correctly orientate the non-standard substrate, as well as the slidable positioning pin 5.

Figure 7:
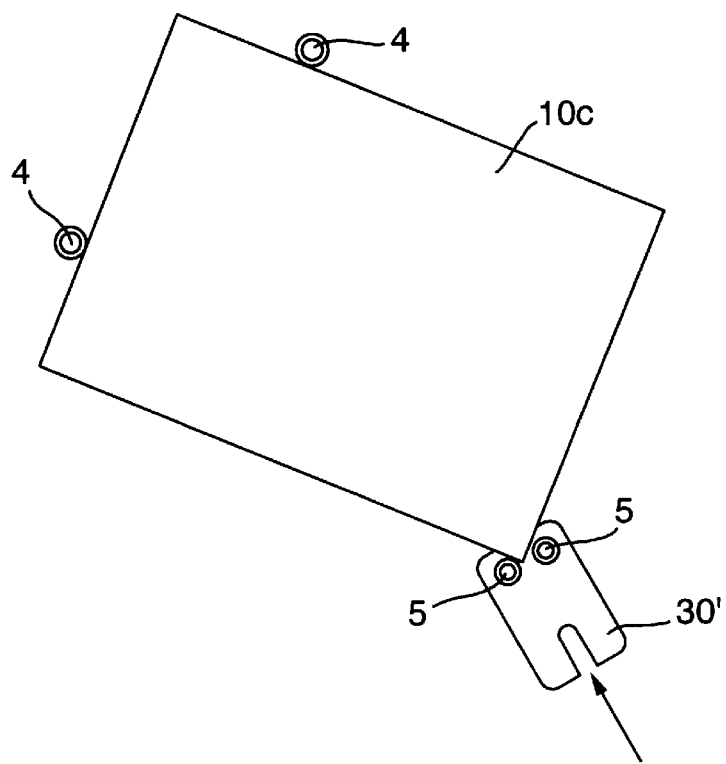
FIG. 7 is a schematic plan view of the intermediate substrate holder of a third embodiment of the invention, showing the pin layout required to hold a rectangular substrate.

FIG. 7 shows an alternative embodiment of the intermediate substrate holder 1 of the present invention with a rectangular substrate 10c. In this case, two of the stationary positioning pins 4 secure one corner of the substrate and two sliding positioning pins 5, mounted on the slidable clamping mechanism 30', secure the opposite corner of the substrate.

Figure 8:
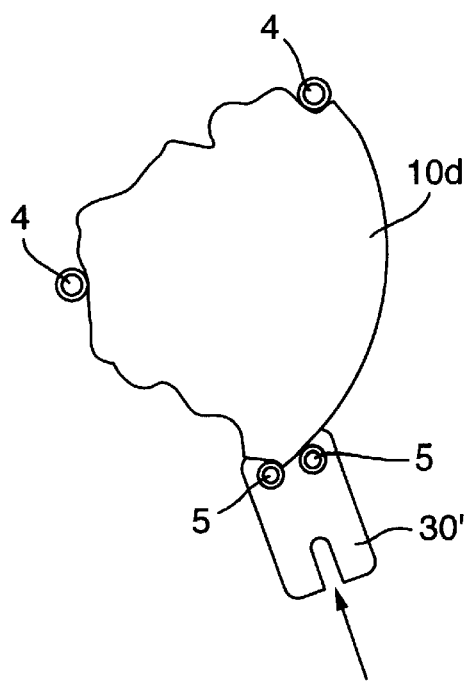
FIG. 8 is a schematic plan view of the intermediate substrate holder of the third embodiment of the invention, showing the pin layout required to hold an irregular-shaped substrate.

FIG. 8 shows the same arrangement of the present invention as in FIG. 7, for holding a rectangular substrate, but as used for holding a piece of substrate 10d that has broken off from a complete substrate. In this case, each of the pairs of pins 4, 5 is used to secure either a corner or an edge, depending on the shape of the broken piece.

Figure 9:
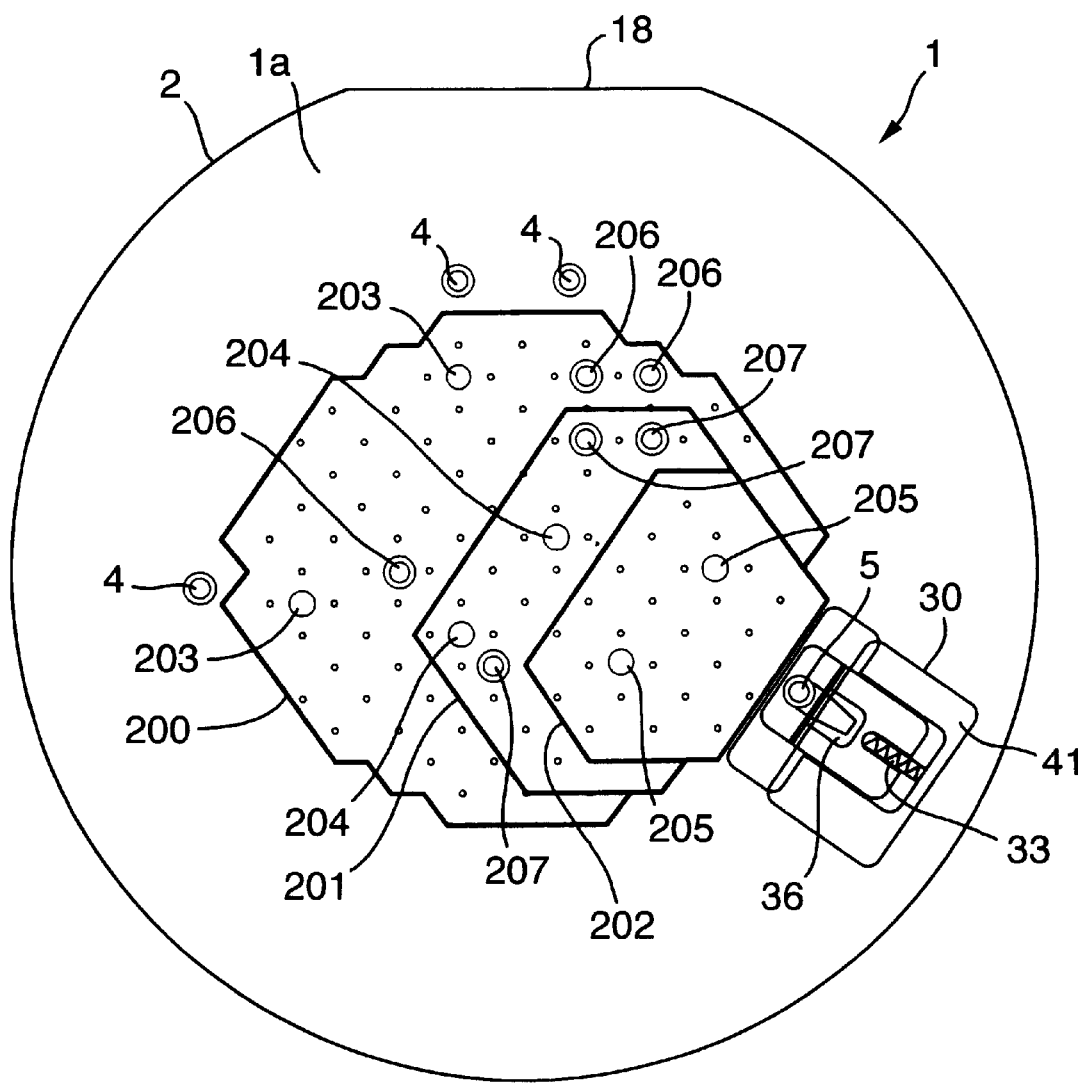
FIG. 9 is a plan view of the intermediate substrate holder provided with a series of nested barriers.

It should be appreciated that, for some different shapes and sizes of substrate, the central area 3 of the intermediate substrate holder 1 may need to have a different size or shape, in order that the vacuum area enclosed by the barrier 9 be completely covered by the non-standard substrate 10, such that when a vacuum is present it will properly hold the substrate 10 onto the intermediate substrate holder 1. This is overcome, as shown in FIG. 9, by arranging an intermediate substrate holder with a series of barriers 200, 201, 202 arranged in nested fashion on the upper surface 1a of the intermediate substrate holder. This creates a range of sizes of vacuum area. Each vacuum area enclosure (bounded in the example of FIG. 9 by 200 and 201, 201 and 202, and by 202 alone) has its own through-holes 203, 204, 205 respectively. The through-holes are either selectively closeable or selectively exposed to vacuum on the underside of the intermediate substrate holder 1. Extra stationary positioning pins 206, 207, which are removable, are provided to secure the non-standard substrates 10 placed on the inner two barriers 201, 202.

It should further be appreciated that, while in the embodiments described above the non-standard substrate 10a–10d is secured to the intermediate substrate holder 1 by means of both a vacuum and by the positioning pins, other embodiments of the present invention could use only one of these two securing methods.

While we have described above specific embodiments of the invention it will be appreciated that the invention may be practiced otherwise than described. The description is not intended to limit the invention.

What is claimed is:

1. A lithographic projection apparatus comprising:

a radiation system for supplying a projection beam of radiation;

a support structure for supporting patterning structure, the patterning structure serving to produce a desired pattern in the projection beam;

a substrate table provided with a first substrate holder constructed to hold a substrate of a first type;

a projection system constructed and arranged to project the patterned beam onto a target portion of the substrate; and an intermediate substrate holder that can be held by the first substrate holder and provided with a second substrate holder constructed to hold a substrate of a second type.

2. Apparatus according to claim 1 wherein the second holding structure comprises vacuum holding structure.

3. Apparatus according to claim 2 wherein the vacuum holding structure is located on the intermediate substrate holder and comprises:

a vacuum space on which the substrate of the second type can be placed;

a barrier around the edge of the vacuum space, serving to close off the vacuum space; and a vacuum generator, constructed and arranged to produce a vacuum in the vacuum space.

4. Apparatus according to claim 3 wherein the barrier comprises of a series of nested barriers, each defining a discrete vacuum space on which differing sizes of substrate of the second type can be placed, and each able to make a sealing arrangement with substrates of the second type that are of a sufficient size;

and the vacuum generator is selectively and separately engageable to produce a vacuum each of the discrete vacuum spaces.

5. Apparatus according to claim 1 wherein said second holding structure comprises a mechanical clamp.

6. Apparatus according to claim 5 wherein the clamp is located on the intermediate substrate holder and comprise two or more stationary positioning pins opposed by a slidable mechanism that is provided with at least one sliding positioning pin mounted thereon and that is biased to move the sliding positioning pin towards the stationary pins.

7. Apparatus according to claim 1 wherein the intermediate substrate holder is capable of holding a substrate of the second type that is smaller than a substrate of the first type.

8. Apparatus according to claim 1 wherein the intermediate substrate holder is capable of holding a substrate of the second type that is substantially non-circular in shape.

9. Apparatus according to claim 1 wherein the intermediate substrate holder is capable of holding a substrate of the second type that is a piece of a broken substrate of the first type.

10. A device manufacturing method comprising:

projecting a patterned beam of radiation onto a target portion of a layer of radiation-sensitive material on a substrate of a first type held by an intermediate substrate holder which is held by a substrate holder constructed to hold a substrate of a second type on a substrate table thereof; and providing the intermediate substrate holder, with the substrate of the first type held thereon, to said substrate table.

11. A device manufactured according to the method of claim 10.

12. An intermediate substrate holder comprising:

a substantially planar body having a first major surface;

a matrix of protrusions extending from the first major surface, for supporting a substrate;

a barrier provided on the first major surface for defining a vacuum space between the first major surface and a substrate resting against the protrusions;

a vacuum generator, constructed and arrayed to expose the vacuum space to a vacuum, wherein said intermediate substrate holder is held by another substrate holder.

13. An intermediate substrate holder according to claim 12, further comprising positioning pins, mounted on the surface of the intermediate substrate holder outside of the barrier means, at least two of which are stationary, and at least one of which is mounted on a slidable mechanism that is biased towards the stationary positioning pins, said positioning pins being adapted to hold said substrate on the intermediate substrate holder.

14. An intermediate substrate holder according to claim 12, wherein the barrier comprises a series of nested barriers, each defining a discrete vacuum space on which differing sizes of substrate can be placed, and each able to make a sealing arrangement with substrates that are of a sufficient size;

and the vacuum generator is adapted to separately and selectively expose each of the discrete vacuum spaces to vacuum.

* * * * *